(12) United States Patent
Lien et al.

(10) Patent No.: US 6,373,739 B1
(45) Date of Patent: Apr. 16, 2002

(54) QUAD CAM CELL WITH MINIMUM CELL SIZE

(75) Inventors: Chuen-Der Lien, Los Altos Hills; Chau-Chin Wu, Cupertino, both of CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/731,160

(22) Filed: Dec. 6, 2000

(51) Int. Cl.[7] ............................................. G11C 15/00
(52) U.S. Cl. ....................... 365/49; 365/168; 711/108
(58) Field of Search ............................. 365/49, 189.07, 365/168; 711/108

(56) References Cited

U.S. PATENT DOCUMENTS

| | | | |
|---|---|---|---|
| 5,841,874 A | | 11/1998 | Kempke et al. ............... 380/50 |
| 6,154,384 A | * | 4/2000 | Nataraj et al. ................. 365/49 |
| 6,081,440 A | * | 6/2000 | Washburn et al. ............. 365/49 |
| 6,262,907 B1 | * | 7/2001 | Lien et al. ..................... 365/49 |
| 6,288,922 B1 | * | 9/2001 | Wong et al. ................... 365/49 |

* cited by examiner

Primary Examiner—Tan T. Nguyen
(74) Attorney, Agent, or Firm—Bever Hoffman & Harms LLP

(57) ABSTRACT

A four-state (quad) CAM cell that stores one of four logic values: a logic high value, a logic low value, a logic high don't care value, and a logic low don't care value. Each quad CAM cell includes a first memory cell, a second memory cell, a comparator circuit, and a control switch. The first memory cell stores a data value (i.e., logic high value or logic low value), and transmits this stored data value to the comparator circuit. The second memory cell stores a care/don't care data value that is transmitted to the control switch. Portions of the comparator circuit and the control switch form a discharge path between a match line and a discharge line connected to the quad CAM cell. The control switch is controlled by the care/don't care value to open/close a first part of the discharge path. The comparator circuit is controlled to open a second part of the discharge path when, for example, the stored data value is equal to an applied data value.

20 Claims, 6 Drawing Sheets

QUAD CAM CELL WITH MINIMUM CELL SIZE

FIELD OF THE INVENTION

The present invention relates to content addressable memory (CAM) arrays. More specifically, the present invention relates to quad (i.e., four-state) CAM cells and methods for operating these cells in a CAM array.

DISCUSSION OF RELATED ART

Unlike conventional random access memory (RAM) arrays, CAM arrays include memory cells that are addressed in response to their content, rather than by a physical address within a RAM array. That is, data words stored in a RAM array are accessed by applying address signals to the RAM array input terminals. In response to each unique set of address signals, a RAM array outputs a data value that is read from a portion of the RAM array designated by the address. In contrast, a CAM array receives a data value that is compared with all of the data values stored in rows of the CAM array. In response to each unique data value applied to the CAM array input terminals, the rows of CAM cells within the CAM array assert or de-assert associated match signals indicating whether or not one or more data values stored in the CAM cell rows match the applied data value.

CAM arrays are useful in many applications, such as search engines. For example, assume an employee list is searched to identify all employees with the first name "John". The first names are written into a CAM array such that they are stored in a predetermined order (e.g., according to employee number). The compare data value ("John") is then applied to the CAM input terminals. When one or more stored data values match the compare data value (a match condition), the match line coupled to the one or more matching rows of CAM cells generates a match value (e.g., a logic high value) output signal. The rows having CAM cells having stored data values that do not match the compare data value (a no-match condition) generate a no-match value (e.g., a logic low value) output signal on the associated match lines. By identifying which rows have associated high match lines, and comparing those row numbers with the employee number list, all employees named "John" are identified. Note that some CAM arrays generate a logic low value as a match value output signal. In contrast, to search a RAM array containing the same employee list, a series of addresses must be applied to the RAM array so that each stored data value is read out and compared with the "John" data value. Because each RAM read operation takes one clock cycle, a relatively large amount of time is required to read and compare a particular data value with all data values stored in a RAM array.

Two commonly-used CAM cells are binary CAM cells and ternary CAM cells, whose names are derived from the number of data values that they store.

Binary CAM cells stores one of two logic values: a logic high value or a logic low value. When an applied data value (e.g., logic high) is equal to the logic value stored by a binary CAM cell, then a match signal is transmitted on a match line connected to the binary CAM cell (e.g., the match line is maintained in a high voltage state). When all applied data values of an applied search term (e.g., "John") are applied to a row of binary CAM cells collectively storing the term, then the match line connected to that row of binary CAM cells indicated the match. Conversely, when an applied data value is not equal to the logic value stored in a binary CAM cell, then a no-match signal is transmitted on the match line (e.g., the binary CAM cell discharges the match line to ground). This no-match signal is applied to the match line even if other stored data values match the applied data values (e.g., the applied search term "John" is compared to the stored term "Joan").

A limitation associated with binary CAM cells arises when an "open-ended" search is desired. An "open-ended" search includes one or more specific data values that must be matched by the stored data values, and one or more non-specific data values, which are referred to herein as "don't care" data values, that need not be matched by the stored data value. For example, instead of searching only for employees named "John", it may be desirable to search for any variation on "John", such as "Jon", "Johann", "Johnny", etc. In this example, an open-ended search might search for the first two letters "Jo", and ignore any subsequent letters in the data word (i.e., the don't care values). Such an open-ended search is possible using binary CAM cells, but requires pre-processing of the stored data values and/or the applied data values such that, for example, all logic high values or all logic low values are stored/compared in the "don't care" letter locations.

Ternary CAM cells address the limitations of binary CAM cells by allowing a user to store one of three logic values: a logic high value, a logic low value, and a don't care logic value. The don't care logic value maintains the match signal whether the applied data value is a logic high value or a logic low value, thereby avoiding the need for pre-processing of the applied data value. For example, the name "John" may be stored as "J-o-DC-DC . . . DC", where "DC" represents a don't care logic value. Similarly, the name "Johnny" may be stored as "J-o-DC-DC . . . DC". Accordingly, in the above-mentioned open-ended search for all variations of the name "John" (i.e., "Jo"), match signals are generated by both the row containing "John" (wherein the letters "hn" are replaced with don't care logic values) and "Johnny" (wherein the letters "hnny" are replaced with don't care logic values).

A problem with ternary CAM cells is that the logic high and logic low values associated with a data bit are lost when the data bit is stored as a don't care logic value in a ternary CAM cell. That is, using the example provided above, assume that several employee names are stored in a CAM array made up of ternary CAM cells such that don't care logic values are used in place of all letters after the second letter of each name. Assume also that both the name "John" and the name "Joan" are stored in the CAM array as "J-o-DC-DC". Under these conditions, both the names "John" and "Joan" would generate a match signal using the open-ended search for "Jo". When this occurs, it is not possible to read out the names from the CAM array to determine which matching row contains "John" and which matching row contains "Joan".

Accordingly, what is needed is a four-state (herein referred to a "quad") CAM cell that stores a logic low value, a logic high value, a logic low don't care value, and a logic high don't care value, thereby allowing the original data value (either logic high or logic low) to be stored in the CAM array. Such a quad CAM cell would facilitate storing, for example, both the name "John" and the name "Joan" as "J-o-DC-DC" for comparison purposes, but also would retain the original data values "hn" and "an", respectively, for post-comparison analysis. In addition, what is needed is a quad CAM cell that requires a minimum cell size, thereby minimizing the overall size of a CAM device incorporating an array of the quad CAM cells.

SUMMARY

The present invention is directed to four-state (quad) CAM cells having a minimal cell size. The quad CAM cells of the present invention store one of four logic values: a logic high value, a logic low value, a logic high don't care value, and a logic low don't care value. Accordingly, the quad CAM cell of the present invention beneficially stores a data bit (e.g., a logic high value or a logic low value) of an original data word while allowing the data value to be designated as don't care for comparison operations. As a result, as distinguished from ternary CAM cells, the data value can be read from the quad CAM cell after the comparison operation.

In accordance with an aspect of the present invention, the quad CAM cells are produced using a minimum number of transistors, thereby minimizing the cell size so that a CAM array incorporating the quad CAM cells requires a minimal amount of chip area.

Each quad CAM cell includes a first memory cell, a second memory cell, a comparator circuit, and a control switch. The first memory cell stores a data value (i.e., logic high value or logic low value), and transmits this stored data value to the comparator circuit. The second memory cell stores a care/don't care data value that is transmitted to the control switch. Portions of the comparator circuit and the control switch form a discharge path between a match line and a discharge line connected to the quad CAM cell. The control switch is controlled by the care/don't care value to open/close a first part of the discharge path. The comparator circuit is controlled to open a second part of the discharge path when, for example, the stored data value is equal to an applied data value. For example, in an embodiment where the match line is discharged to indicate a no-match condition, a "care" value (i.e., the opposite of a don't care value) stored in the second memory cell causes the control switch to open the first part of the discharge path, and when the comparator circuit opens the second part of the signal path when the stored data value transmitted from the first memory cell is different from the applied data value, thereby discharging the match line to the discharge line. Conversely, when the second memory cell stores a don't care data value, or when the applied data value matches the stored data value, then the signal path remains closed and the match line remains charged.

Several specific embodiments of quad CAM cells according to the present invention are disclosed. In each disclosed embodiment, the first memory cell is implemented as an SRAM cell including a latch for storing the stored data value at a first node, and an inverse of the stored data value at a second node. In a first disclosed embodiment, the comparator circuit includes pass transistors connected in series between the control circuit and the discharge line, with the gate terminals of the pass transistors respectively connected to the first memory cell and a data line. In a second disclosed embodiment, pass transistors of the comparator circuit are connected in series between the control circuit and the match line. In a third disclosed embodiment, the comparator circuit is separated into two parts that are arranged such that the control circuit is located between and connected in series with the two parts between the discharge line and the match line. In a fourth disclosed embodiment, the comparator circuit includes a first pass transistor connected in series with the control circuit between the match line and the discharge line, and an additional pass transistor connected between the data line and the first pass transistor, and having a gate terminal controlled by the first memory cell.

The present invention will be more fully understood in view of the following description and drawings.

DETAILED DESCRIPTION

Figure 1:
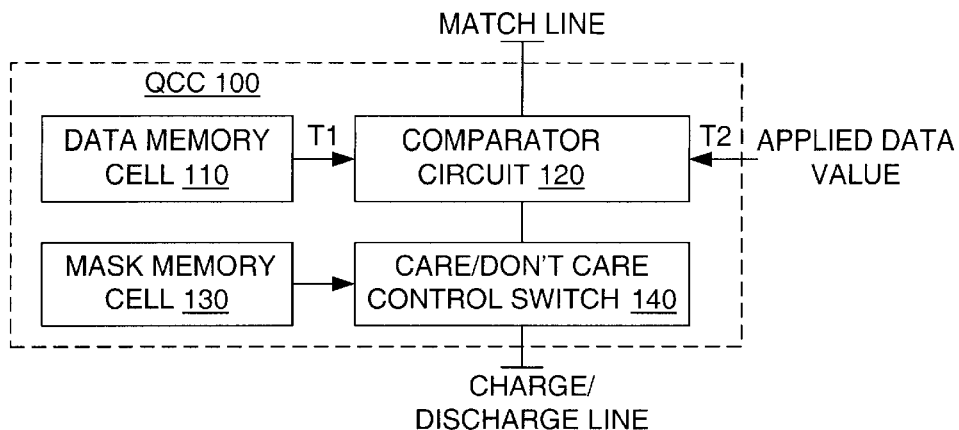
FIG. 1 is a block diagram showing a quad CAM cell in accordance with he present invention.

FIG. 1 is a block diagram showing a simplified quad CAM cell (QCC) 100 in accordance with the present invention. QCC 100 includes a data (first) memory cell 110, a comparator circuit 120, a mask (second) memory cell 130, and a "care/don't care" control switch 140.

Data memory cell 100 stores a data value (i.e., logic high value or logic low value), and transmits this stored data value to a first terminal T1 of comparator circuit 120. Comparator circuit 120 also receives an applied data value at a second terminal T2 from an external data line (not shown).

Mask memory cell 130 stores a care/don't care value that is transmitted to control switch 140.

Comparator circuit 120 is controlled by the data value stored in data memory cell 110 and by the applied data value received at terminal T2 to open or close a portion of a charge/discharge path extending between a match line and a charge/discharge line that are connected to QCC 100. For example, when the stored data value and the applied data value are not equal (a no-match condition), comparator circuit 120 opens the first portion of the charge/discharge path. Alternatively, when the stored data value and the applied data value are equal (a "match" condition), comparator circuit 120 closes the first portion of the charge/discharge path.

Similarly, control switch 140 is controlled by the care/don't care value stored in mask memory cell 130 to open or close a second portion of the charge/discharge path extending between the match line and the charge/discharge line. For example, when control switch 140 stores a "care" value, the second portion of the charge/discharge path controlled by control switch 140 is opened, and when control switch 140 stores a don't care value, the portion of the charge/discharge path controlled by control switch 140 is closed.

During operation, in accordance with a predefined convention, comparator circuit 120 and control switch 140 are controlled by the stored data value, the applied data value, and the care/don't care data value to maintain a preset voltage level on the match line, or to charge/discharge the match line by opening the charge/discharge path. The charged or discharged state of the match line is measured by a sensing circuit (not shown) to determine whether or not (a) a "care" value is stored in mask memory cell 130, and (b) the stored data value in data memory cell 110 fails to match the applied data value applied at terminal T2. In one embodiment, the mask line is pre-charged to a relatively high voltage and the charge/discharge line is maintained in a low voltage state during a compare operation. In this embodiment, the match line remains charged unless both conditions (a) and (b) are met, in which case a discharge path is opened by comparator circuit 120 and control switch 140 to discharge match line MATCH$_1$ to the low voltage maintained on the charge/discharge line. The sensing circuit (not shown) detects this discharged state, which is interpreted as a no-match condition.

Other compare operation and/or match/no-match signal conventions are also possible. For example, in an alternative embodiment, the mask line may be initially discharged, and the charge/discharge line may be maintained in a high voltage state during a compare operation. In this alternative embodiment, the match line remains discharged unless condition (a) is met and condition (b) is not met (i.e., the applied data value matches the stored data value), in which case a charge path is opened by comparator circuit 120 and control switch 140 such that match line MATCH$_1$ is charged by the high voltage maintained on the charge/discharge line. Yet other alternative embodiments are also possible, such as discharging the match line when a match condition exists, or charging the match line with a no-match condition exists. The present invention is intended to cover all such alternative embodiments.

Figure 2:
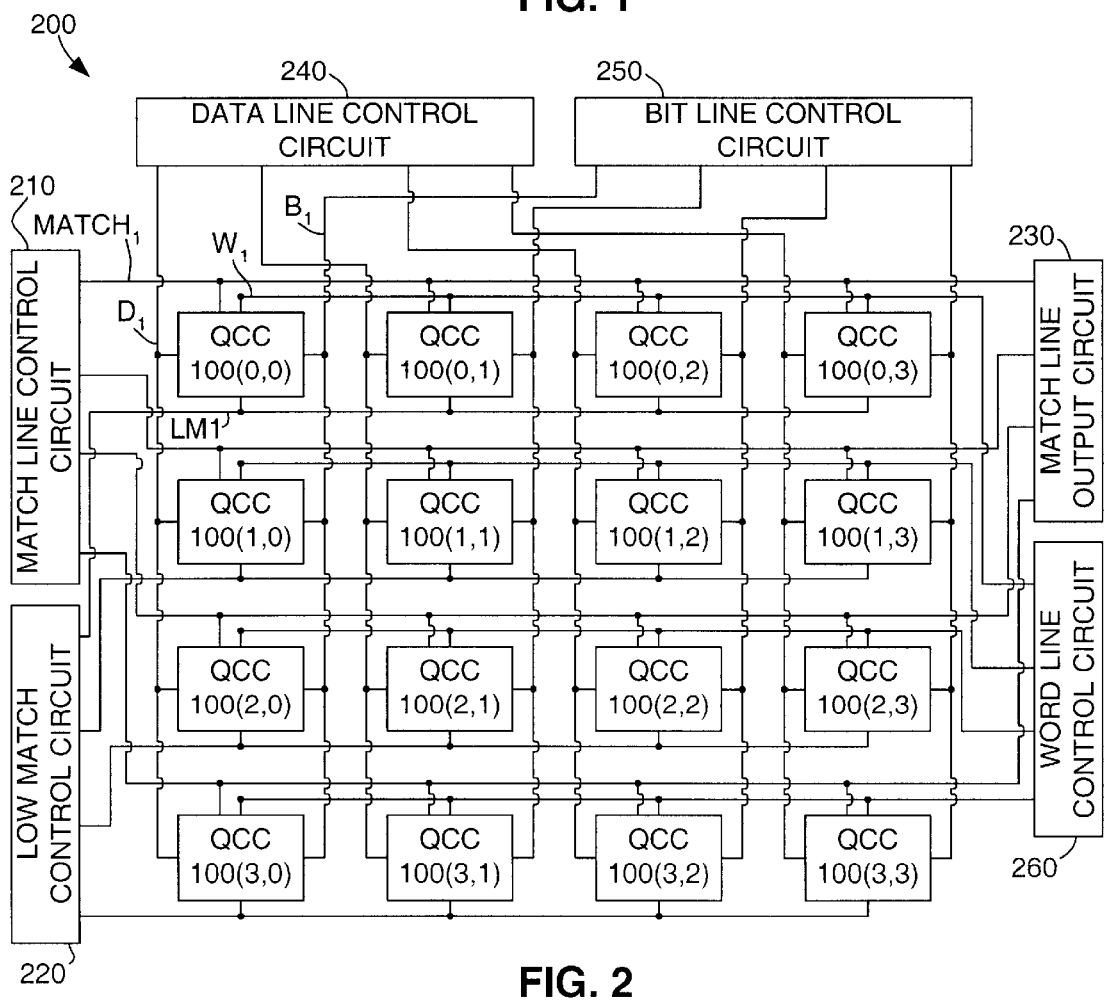
FIG. 2 is a simplified schematic diagram showing a CAM array incorporating multiple quad CAM cells of FIG. 1.

FIG. 2 is a simplified schematic diagram showing a CAM cell array 200 including quad CAM cells 100(0,0) through 100(3,3) that are arranged in rows and columns. Each quad CAM cell 100(0,0) is essentially identical to quad CAM cell 100 (see FIG. 1). Each column of quad CAM cells (e.g., cells 100(0,0) through 100(3,0)) is connected to an associated data line (e.g., data line D$_1$) and an associated bit line (e.g., data line B$_1$). The bit lines are used to transmit data values to the data memory cells (i.e., data memory cell 110; see FIG. 1) of each quad CAM cell in the associated column during data write operations. The data lines are used to transmit applied data values to the comparison circuit (e.g., comparison circuit 120; see FIG. 1) of each quad CAM cell in the associated column during comparison operations. Similarly, each row of quad CAM cells (e.g., cells 100(0,0) through 100(0,3)) is connected to an associated match line (e.g., data line MATCH$_1$), an associated low match (discharge) line (e.g., low match line LM$_1$), and an associated word line (e.g., low match line W$_1$). The word lines are used to address the data memory cells (i.e., data memory cell 110; see FIG. 1) of each quad CAM cell in the associated row during data write operations. The match line associated with each row of quad CAM cells is discharged to the associated low match line in the manner described above when any of the quad CAM cells in the row detect a no-match condition between the applied data value on the associated data line and the stored (first) data value in that quad CAM cell. Stated differently, when any quad CAM cell in a given row (e.g., any of quad CAM cells 100(0,0), 100(0,1), 100(0,2), and 100(0,3)) detects a no-match condition, then the associated match line (e.g., match line MATCH$_1$) is discharged to the associated low match line (e.g., low match line LM$_1$).

In addition to quad CAM cells 100(0,0) through 100(3,3), CAM cell array 200 includes a match line control circuit 210, a low match control circuit 220, a match line output (sensing) circuit 230, a data line control circuit 240, a bit line control circuit 250, and a word line control circuit 260.

Match line control circuit 210 generates a pre-charge on each of several match lines (e.g., match line MATCH$_1$) prior to comparison operations. Such match line control functions are well known in the art.

Low match control circuit 220 controls the low match lines (e.g., low match line LM$_1$) such that they float during non-active periods, and are pulled down to a pre-determined low voltage (e.g., ground or 0 volts) during compare operations. For example, during a standby operation in which the comparator circuits of the quad CAM cells connected to low match line LM$_1$ are not active, low match line LM$_1$ is allowed to float. As a result, low match control circuit 220 provides a power savings selectively de-coupling the un-powered low match line LM$_1$. However, during a compare operation, low match line LM$_1$ is maintained at a logic voltage level by low match control circuit 220. As a result, proper voltages required for the compare operation are provided. Note that, while the embodiments described below couple the low match line to the comparator circuit of selected quad CAM cells, other variations (not shown) may couple the V$_{ss}$ voltage supply source to the comparator instead. However, the resulting CAM cell array will not have the power savings described when using low match control circuit 220.

Match line output circuit 230 senses the charged/discharged state of each match line during compare operations, and passes the resulting match information to associated control circuitry (not shown). Such line sensing functions are well known in the art. Although shown as separate circuits, in an alternative embodiment match line output circuit 230 and match line control circuit 210 can be combined.

Data line control circuit 240, bit line control circuit 250, and word line control circuit 260 perform associated functions using known methods. Data line control circuit 240 transmits applied data signals to selected data lines (e.g., data line D$_1$) during compare operations. Bit line control circuit 250 transmits data signals to selected bit lines (e.g., data line B$_1$) during data write operations. Finally, word line control circuit 260 transmits address signals to selected word lines (e.g., word line W$_1$) during data write operations.

The operation of CAM array 200 is described below with respect to several specific embodiments of quad CAM cell 100.

Figure 3:
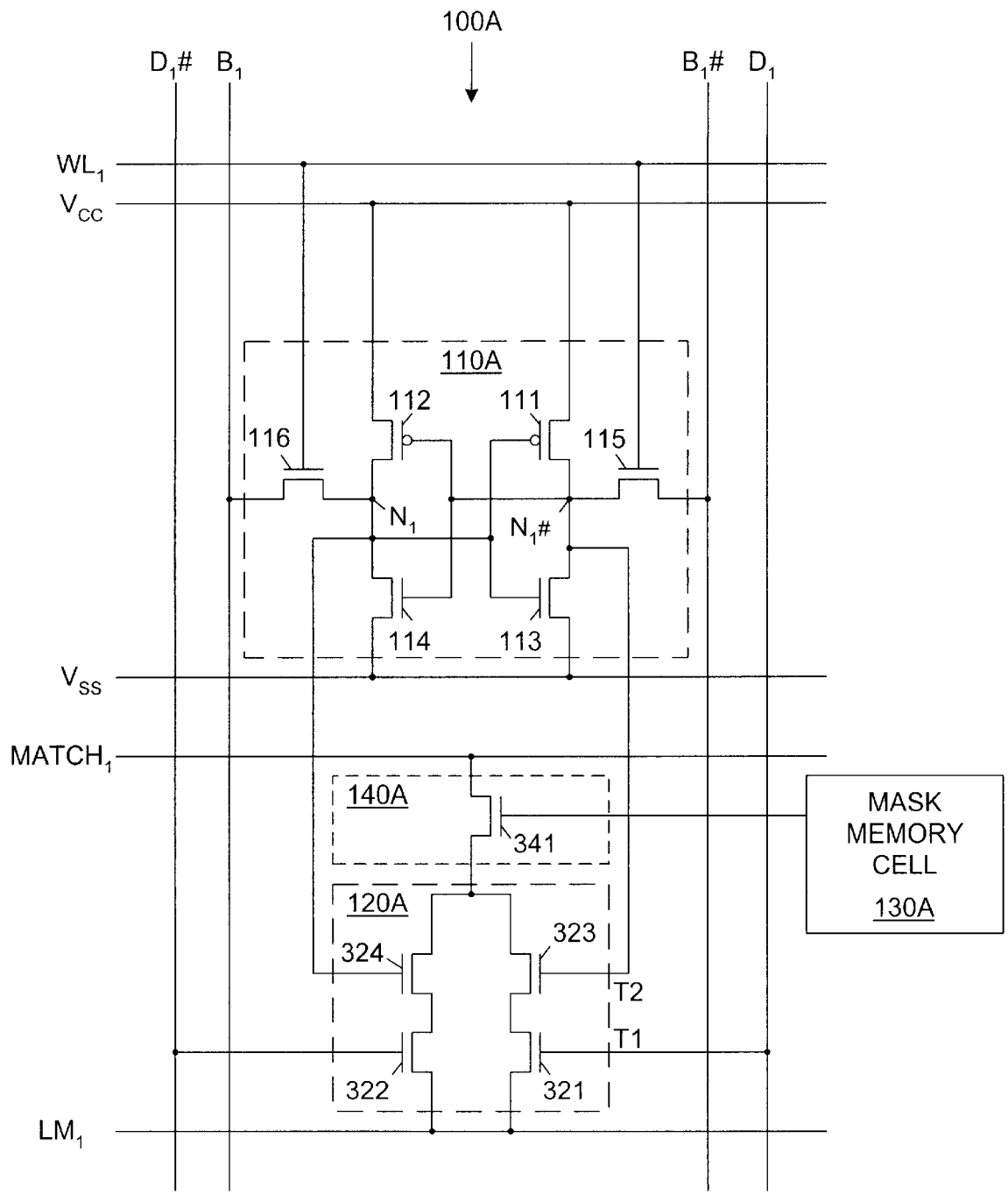
FIG. 3 is a schematic diagram showing a quad CAM cell in accordance with a first specific embodiment of the present invention.

FIG. 3 is a schematic diagram showing a quad CAM cell 100A in accordance with a first specific embodiment of the present invention. Similar to quad CAM cell 100 (see FIG. 1), CAM cell 100A includes an SRAM cell 110A, a comparator circuit 120A, a mask memory cell 130A, and comparator circuit 140A. CAM cell 100A is coupled to bit lines B$_1$ and B$_1$# ("#" is used herein to denote an inverted signal), data lines D$_1$ and D$_1$#, word line WL$_1$, a V$_{cc}$ voltage supply source, a V$_{ss}$ voltage supply source, low match line LM$_1$, and match line MATCH$_1$.

Referring to the upper portion of FIG. 3, SRAM cell 110A includes p-channel transistors 111 and 112 and n-channel transistors 113–116. Transistors 111 and 113 are connected in series between the V$_{cc}$ voltage supply source and the V$_{ss}$ voltage supply source, and transistors 112 and 114 are also connected in series between the V$_{cc}$ voltage supply source and the V$_{ss}$ voltage supply source. Transistors 111 and 113 and transistors 112 and 114 of SRAM cell 110A are cross-coupled to form a storage latch. Specifically, a first storage node N$_1$# that is located between transistors 111 and 113 is connected to the gate terminals of transistors 112 and 114, and a second storage node N$_1$ that is located between transistors 112 and 114 is connected to the gate terminals of transistors 111 and 113. Access transistor 115 is connected between bit line $B_1\#$ and node $N_1\#$. Access transistor 116 is connected between bit line $B_1$ and node $N_1$. The gates of access transistors 115 and 116 are connected to word line $WL_1$. Note that SRAM cell 110A only stores a single data value (bit) that is either a logic high value (e.g., a high voltage signal is maintained at node $N_1$ and a low voltage signal is maintained at inverted node $N_1\#$), or a logic low value (e.g., a low voltage signal is maintained at node $N_1$ and a high voltage signal is maintained at inverted node $N_1\#$)

Referring now to the lower portion of FIG. 3, comparator circuit 120A includes n-channel transistors 321–324. Transistors 321 and 323 are connected in series between control circuit 140A and low match line $LM_1$, and transistors 322 and 324 are also connected in series between control circuit 140A and low match line $LM_1$. The gate terminal of transistor 321 is connected to data line $D_1$, and the gate terminal of transistor 323 is connected to node $N_1\#$. Therefore, transistors 321 and 323 are turned on to open a first path between control circuit 140A and low match line $LM_1$ only when a high applied data signal transmitted on data line $D_1$ and a high data signal is stored at node $N_1\#$. Similarly, the gate terminal of transistor 322 is connected to data line $D_1\#$, and the gate terminal of transistor 324 is connected to node $N_1$. Therefore, transistors 322 and 324 are turned on to open a second path between control circuit 140A and low match line $LM_1$ only when a high applied data signal transmitted on data line $D_1\#$ and a high data signal is stored at node $N_1$.

Mask memory cell 130A may be any type of memory storage cell, such as an SRAM cell, a DRAM cell, or a non-volatile memory cell (e.g., a flash memory cell). In one embodiment, mask memory cell 130A is an SRAM cell similar to SRAM cell 110A that is similarly coupled to additional bit, data, or word lines. In another embodiment, mask memory cell 130A is coupled to word line $WL_1$ and one or more of bit lines $B_1$ and $B_1\#$. Note that mask memory cell 130A only stores a single bit that indicates either a "care" (e.g., logic high) value or a don't care (e.g., logic low) value.

Control circuit 140A includes an n-channel pass transistor 341 that is connected between match line $MATCH_1$ and comparator circuit 120A. The gate terminal of transistor 341 is connected to mask memory cell 130A. Accordingly, transistor 341 is turned on to open a path between match line $MATCH_1$ and comparator circuit 120A when a high (e.g., "care") data value is stored in mask memory cell 130A. In contrast, when a low (e.g., don't care) data value is stored in mask memory cell 130A, transistor 341 remains turned off.

Examples of standby, write, read, and compare operations of CAM cell 100A will now be described.

In a standby operation, word line $WL_1$ and data lines $D_1$ and $D_1\#$ are pulled down to logic low values, thereby turning off transistors 115 and 116, 321, and 322, respectively. The value of match line $MATCH_1$ does not matter and is preferably left in its last state. Under these conditions, SRAM cell 110A latches the values at node $N_1$ and the inverted node $N_1\#$.

To write a data value (e.g., a logic high value) to SRAM cell 110A, bit line $B_1$ is held to a first data value (e.g., a logic high value) and bit line $B_1\#$ is held to the inverse of the first write data value (e.g., a logic low value). Data lines $D_1$ and $D_1\#$ are held to logic low values, thereby turning of transistors 321 and 322, respectively. Turned off transistors 321 and 322 de-couple match line $MATCH_1$ from low match line $LM_1$, thereby preventing the write operation from changing the state of match line $MATCH_1$. Match line $MATCH_1$ is maintained in its last state. Note that the value stored in mask memory cell 130A does not affect the write operation. Word line $WL_1$ is then pulled up to a logic high value to turn on transistors 114 and 115, thereby passing the logic values from bit lines $B_1$ and $B_1\#$ to the latch formed by transistors 111–114. To write a logic high value to SRAM cell 110A, bit line $B_1$ is held to a logic high value (i.e., a first write data value) and bit line $B_1\#$ is held to a logic low value. Under these conditions, the logic high value of word line $WL_1$ turns on transistors 115 and 116 to couple the logic low value on bit line $B_1\#$ to node $N_1\#$ and the logic high value on bit line $B_1$ to node $N_1$, thereby pulling up node $N_1$ to a logic high value and pulling down node $N_1\#$ to a logic low value. As a result, SRAM cell 110A stores a logic high value. Conversely, to write a logic low value to SRAM cell 110A, bit line $B_1$ is held to a logic low value (i.e., a first write data value) and bit line $B_1\#$ is held to a logic high value. Under these conditions, the logic high value of word line $WL_1$ turns on transistors 115 and 116 to pull up node $N_1\#$ to a logic high value and node $N_1$ to a logic low value in a manner similar to that described above. As a result, SRAM cell 110A stores a logic low value.

A read operation from CAM cell 100A will now be described. As described above, because SRAM cell 110A holds a single bit, one of a logic high value and a logic low value may be read from SRAM cell 110A. To read a data value from SRAM cell 110A, both bit lines $B_1\#$ and $B_1$ are pre-charged to a logic high value. Data lines $D_1$ and $D_1\#$ are held to logic low values, thereby de-coupling match line $MATCH_1$ from low match line $LM_1$. Thus, the read operation is prevented from changing the state of match line $MATCH_1$. Match line $MATCH_1$ is left in its last state. Note that the value stored in mask memory cell 130A does not affect the read operation. Word line $WL_1$ is pulled up to a logic high value to perform the read operation. During the read operation, a logic high value is applied to word line $WL_1$ to turn on transistor 116, thereby coupling the pre-charged logic high value of bit line $B_1$ to node $N_1$. The logic high value on bit line $B_1$ is then pulled high or low by the data value stored at node $N_1$. Specifically, a logic low value stored at node $N_1$ pulls down bit line $B_1$ to a logic low value, and a logic high value stored at node $N_1$ causes bit line $B_1$ to remain at a logic high value. Similarly, the logic high value of word line $WL_1$ turns on transistor 115, thereby coupling the pre-charged logic high value of bit line $B_1\#$ to node $N_1\#$. As a result, a logic low value stored at node $N_1\#$ pulls down bit line $B_1\#$ to a logic low value and a logic high value stored at node $N_1\#$ causes bit line $B_1\#$ to remain at a logic high value. Note that the data value stored in SRAM cell 110A is available for a read operation for all mask memory cell 130A values.

A compare operation from CAM cell 100A will now be described. During a compare operation, match line line $MATCH_1$ is pre-charged to a logic high value. Both low match line and word line $WL_1$ are held at logic low values. The value of bit lines $B_1$ and $B_1\#$ are not utilized in the compare operation, and are therefore left in their previous states. In the present example, a "match" condition is indicated during a compare operation by a high logic value on match line line $MATCH_1$, and a no-match condition is indicated during a compare operation by a low logic value on match line line $MATCH_1$. Accordingly, in a match condition, match line $MATCH_1$ remains isolated from low match line $LM_1$ by either comparator circuit 120A or control circuit 140A. Conversely, during a no-match condition, match line $MATCH_1$ is coupled to low match line $LM_1$ through comparator circuit 120A or control circuit 140A.

A no-match condition can only occur during a compare operation if a high "care" data value is stored in mask memory cell 130A. Referring to FIG. 3, a high "care" data value is needed to turn on transistor 341 of control circuit 140A, thereby allowing match line MATCH$_1$ to discharge to low match line LM$_1$ when comparator circuit 120A detects a mismatch between the applied data value and the stored data value. If a low don't care data value is stored in mask memory cell 130A, then transistor 341 remains turned off, and match line line MATCH$_1$ remains isolated from low match line LM$_1$ even if comparator circuit 120A detects a mismatch between the applied data value and the stored data value.

With control circuit 140A turned on, comparator circuit 120A indicates a no-match condition during a compare operation when either (a) both the applied data value on data line D$_1$ and the inverted data value at node N$_1$# are logic high values, or (b) both the applied data value on data line D$_1$# and the data value at node N$_1$ are logic high values. When both the applied data value on data line D$_1$ and the inverted data value at node N$_1$# are logic high values, both transistors 321 and 323 are turned on, thereby completing the discharge path from match line MATCH$_1$ to low match line LM$_1$. Similarly, when both the applied data value on data line D$_1$# and the data value at node N$_1$ are logic high values, both transistors 322 and 324 are turned on, thereby completing the discharge path from match line MATCH$_1$ to low match line LM$_1$. When these two conditions are not met, at least one of transistors 321 and 323 remains turned off, and at least one of transistors 322 and 324, thereby blocking the discharge path from match line MATCH$_1$ to low match line LM$_1$.

Note that CAM cell 100A stores a logic low don't care value in mask memory cell 130A to indicate a don't care condition. SRAM cell 110A still stores one of a logic high and a logic low value. In this way, CAM cell 100A does not participate in the compare operation, yet retains meaningful data for read operations. Accordingly, data words (e.g., "John" and "Joan") can be stored in respective rows of quad CAM cells, and a compare operation can be performed to identify data words having common characters (e.g., "J-o-DC-DC") by designating the last two letters in each row as don't care (i.e., writing high data values to their respective mask memory cells). Accordingly, the match lines connected to these two rows would remain logic high during the compare operation, thereby indicating that both of these rows contain the sought after data. Because the actual data words are stored in the quad CAM cells of these rows, this actual data can then be read to distinguish between the two data words. By comparison, if ternary CAM cells were used, both data words would be stored as "J-o-DC-DC", and post-comparison reading of the ternary CAM cell would not permit distinguishing between the two data words.

Numerous variations to quad CAM cell 100A are possible without detracting from the spirit and scope of the present invention. Several alternative embodiments including examples of these variations are provided below with reference to FIGS. 4–6.

Figure 4:
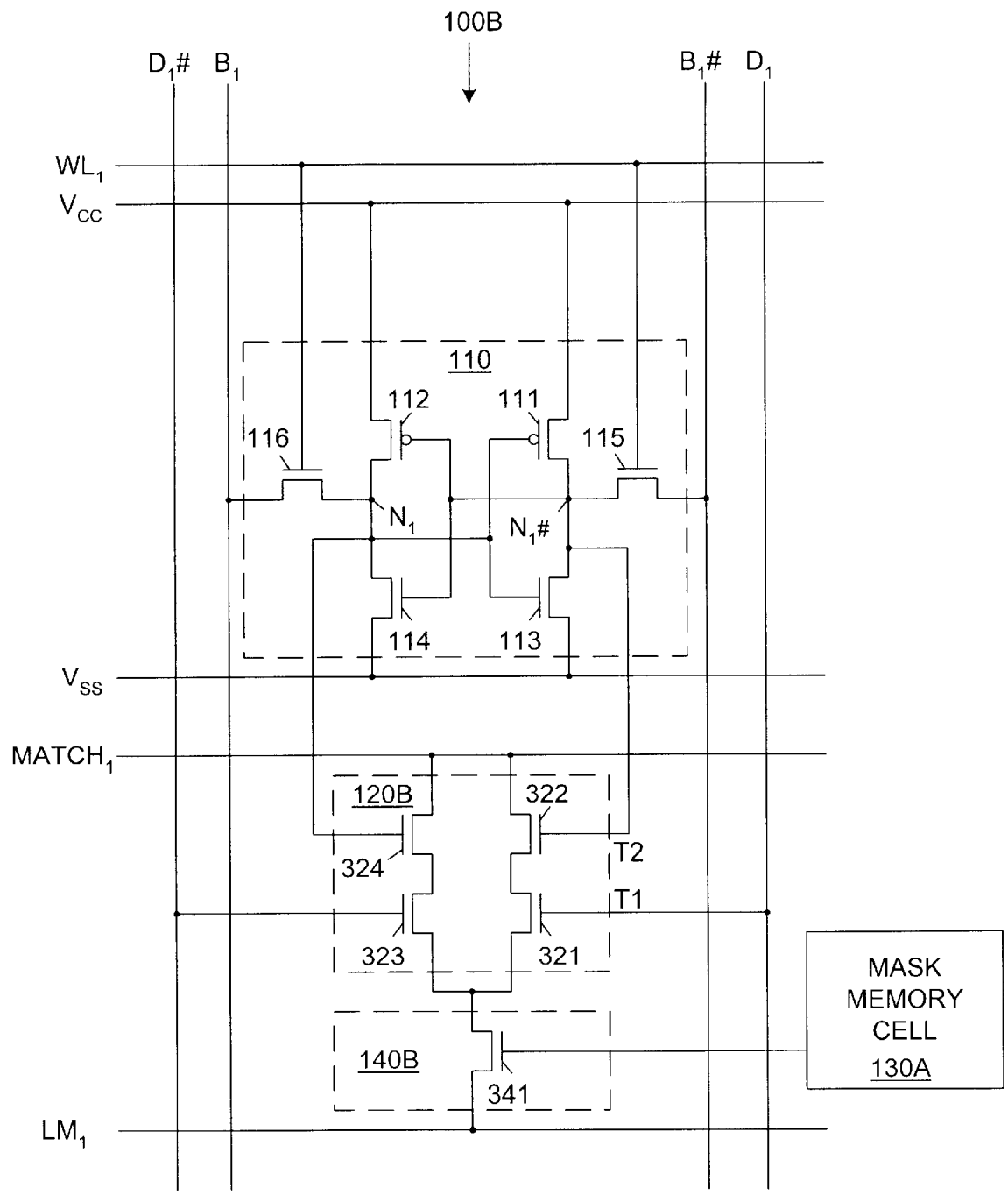
FIG. 4 is a schematic diagram showing a quad CAM cell in accordance with a second specific embodiment of the present invention.

FIG. 4 is a schematic diagram showing a quad CAM cell 100B in accordance with a second specific embodiment of the present invention. Similar elements in CAM cells 100A (FIG. 3) and 100B are labeled similarly. Quad CAM cell 100B includes an SRAM cell 110A and a mask memory cell 130A that are identical to that used in quad CAM cell 100A (see FIG. 3). In addition, quad CAM cell 100B includes a comparator circuit 120B and a control circuit 140B that are essentially identical to comparator circuit 120A and control circuit 140A of quad CAM cell 100A (see FIG. 3). However, note that the position of comparator circuit 120B and control circuit 140B are reversed such that comparator circuit 120B is located between match line MATCH$_1$ and control circuit 140B, and control circuit 140B is located between comparator circuit 120B and low match line LM$_1$. Quad CAM cell 100B operates similarly to quad CAM cell 100A.

Figure 5:
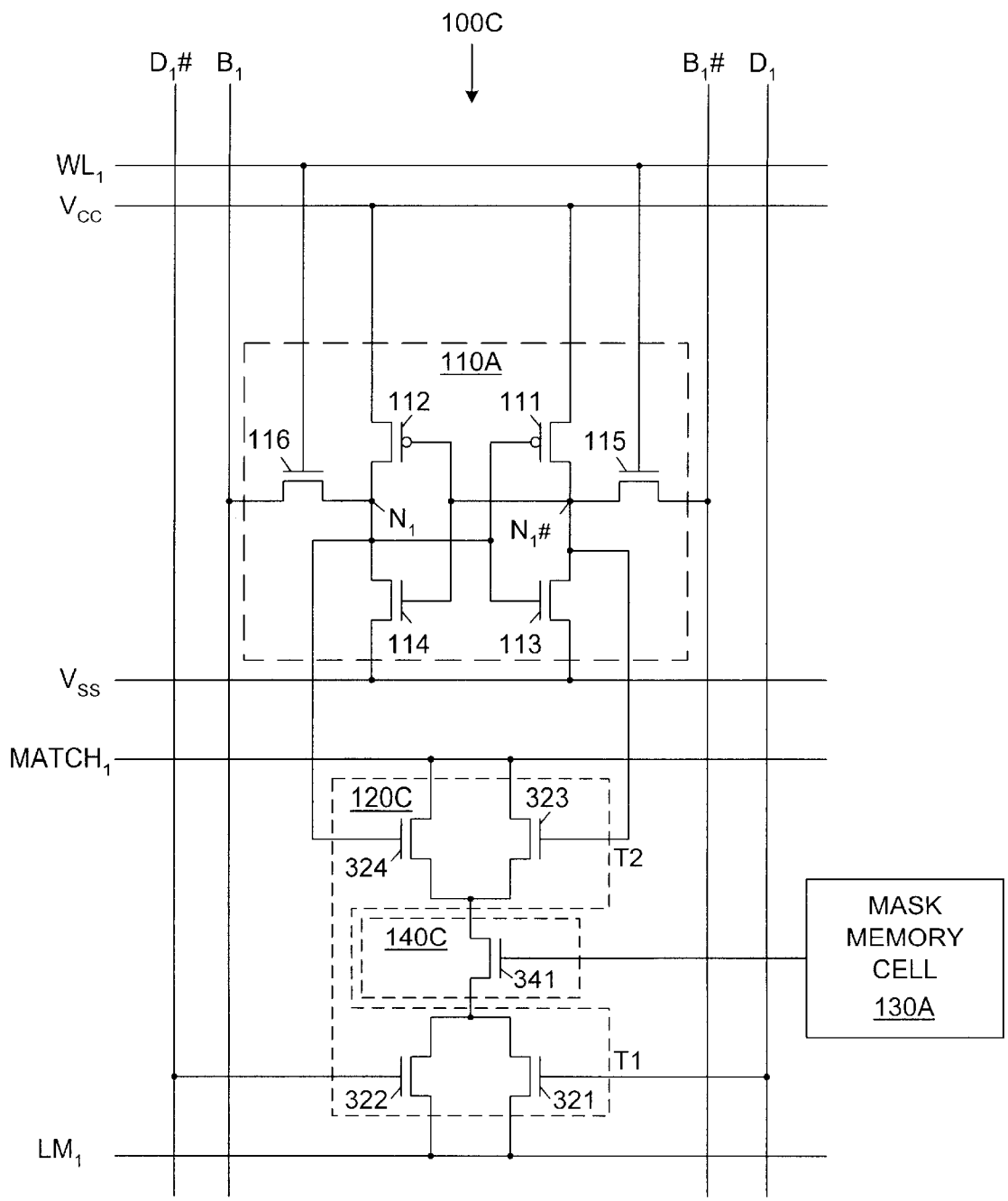
FIG. 5 is a schematic diagram showing a quad CAM cell in accordance with a third specific embodiment of the present invention.

FIG. 5 is a schematic diagram showing a quad CAM cell 100C in accordance with a third specific embodiment of the present invention. Similar elements in CAM cells 100A (FIG. 3) and 100C are labeled similarly. Quad CAM cell 100C includes an SRAM cell 110A and a mask memory cell 130A that are identical to that used in quad CAM cells 100A and 100B. In addition, quad CAM cell 100C includes a comparator circuit 120C and a control circuit 140C that perform the same function of comparator circuit 120A and control circuit 140A of quad CAM cell 100A (see FIG. 3). However, note that comparator circuit 120C is separated into two portions that are respectively located above and below control circuit 140B. Specifically, transistors 321 and 322 of comparator circuit 120C are located between transistor 341 of control circuit 140C and low match line LM$_1$, and transistors 323 and 324 of comparator circuit 120C are located between transistor 341 of control circuit 140C and match line MATCH$_1$. Apart from this difference, quad CAM cell 100C operates similarly to quad CAM cell 100A (discussed above).

Figure 6:
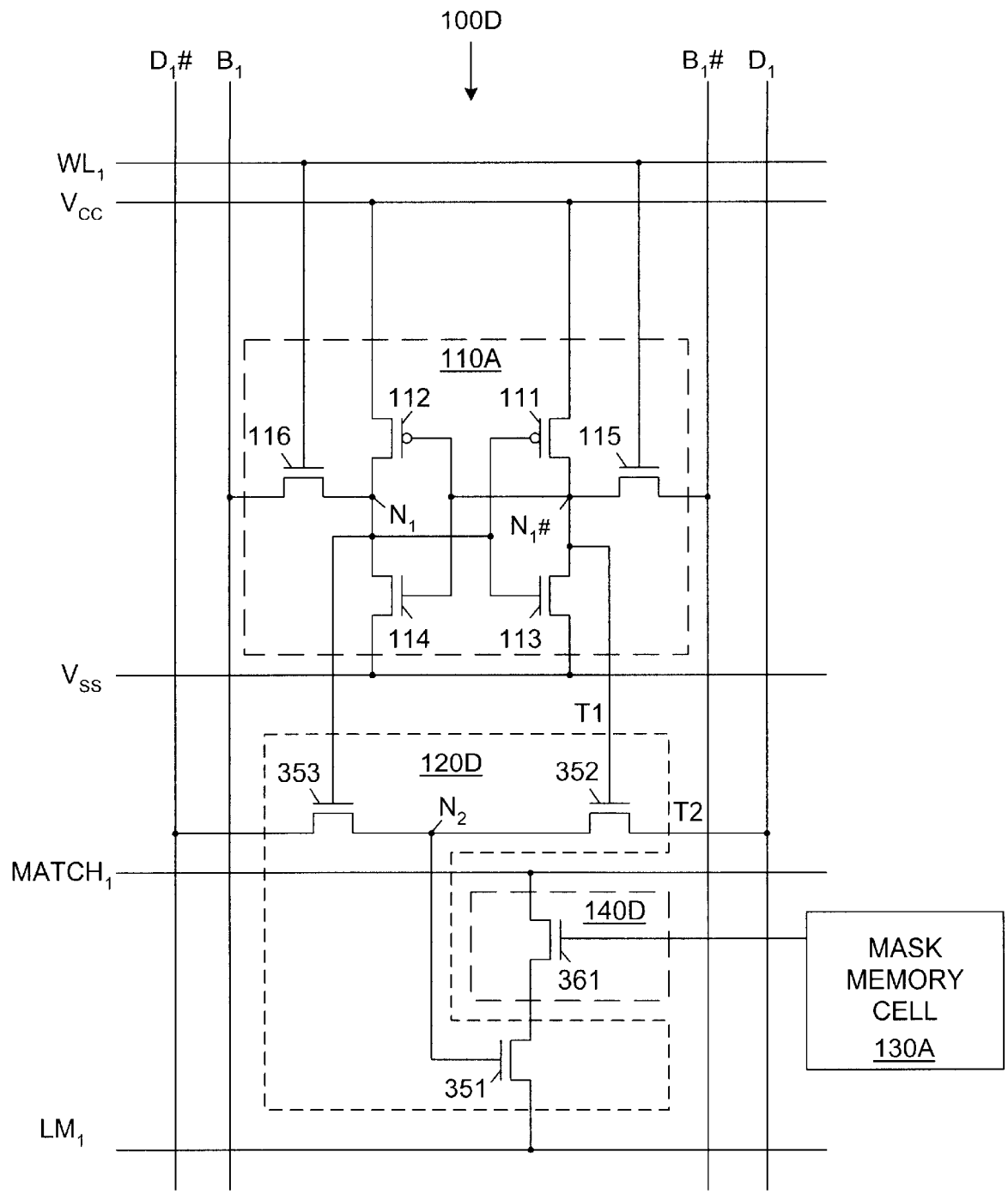
FIG. 6 is a schematic diagram showing a quad CAM cell in accordance with a fourth specific embodiment of the present invention.

FIG. 6 is a schematic diagram showing a quad CAM cell 100D in accordance with a fourth specific embodiment of the present invention. Similar elements in CAM cells 100A and 100D are labeled similarly. Quad CAM cell 100D includes an SRAM cell 110A and a mask memory cell 130A that are identical to that used in quad CAM cells 100A, 100B, and 100C. In addition, quad CAM cell 100D includes a comparator circuit 120D and a control circuit 140D that perform a similar function to that performed by comparator circuit 120A and control circuit 140A of quad CAM cell 100A (see FIG. 3). However, note that comparator circuit 120C is implemented three transistors, instead of the four transistors required in each of quad CAM cells 100A, 100B, and 100C, thereby causing quad CAM cell 100D to have a smaller cell size while providing all of the benefits associated with the larger embodiments.

Referring to the lower portion of FIG. 6, comparator circuit 120D includes n-channel transistors 351, 352, and 353. Transistor 351 is connected in series with control circuit 140D, which in the disclosed embodiment is implemented by an n-channel transistor 361, between match line MATCH$_1$ and low match line LM$_1$. In an alternative embodiment (not shown), transistor 351 and control circuit 140D may be reversed such that transistor 351 is between control circuit 140D and match line MATCH$_1$. Referring again to FIG. 6, transistor 352 has a first terminal connected to data line D$_1$, a gate terminal connected to inverted node N$_1$#, and a second terminal connected to a node N$_2$, which is connected to the gate terminal of transistor 351. Accordingly, transistor 351 is turned on during a compare operation to open a portion of a discharge path between match line MATCH$_1$ and low match line LM$_1$ when both a high voltage signal is stored at inverted node N$_1$# (which turns on transistor 352), and a high voltage signal is applied to data line D$_1$ (which is passed by turned-on transistor 352). Similarly, transistor 353 has a first terminal connected to inverted data line D$_1$#, a gate terminal connected to node N$_1$, and a second terminal connected to node N$_2$. Accordingly, transistor 351 is also turned on during a compare operation when both a high voltage signal is stored at node N$_1$ (which turns on transistor 353) and a high voltage signal is applied to inverted data line D$_1$# (which is passed by turned-on transistor 353). As in the other embodiments described above, during compare operations, match line $MATCH_1$ is discharged to low match line $LM_1$ only when transistor 351 is turned on in the manner described above, and control circuit 140D is turned on (i.e., a high don't care value is stored in mask memory cell 130A).

CAM cell 100D operates similarly to CAM cell 100A during standby, write, and read operations. Therefore, these operations are not repeated here.

Although the invention has been described in connection with the present embodiments, it is understood that this invention is not limited to the embodiment disclosed, but is capable of various modifications that would be apparent to a person skilled in the art.

For example, a match line may be discharged through a steady state grounding voltage instead of using a controllable low match line.

Figure 7:
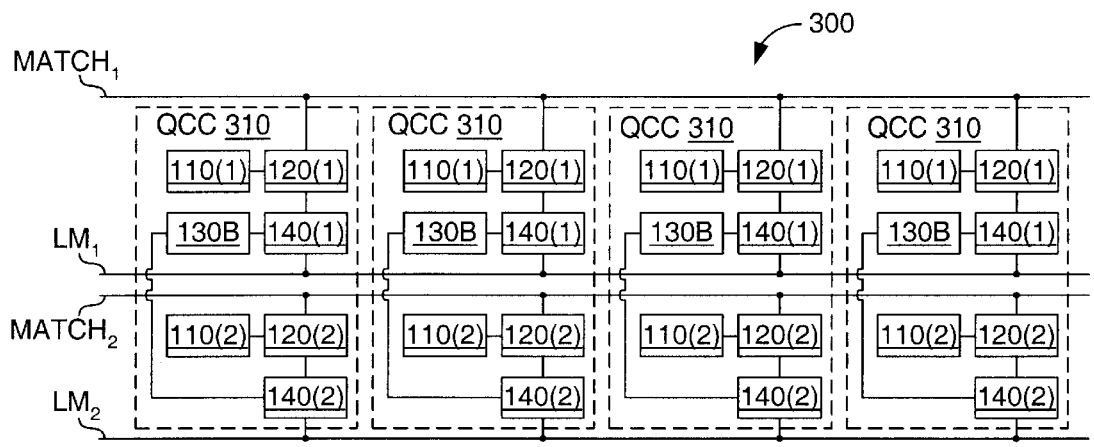
FIG. 7 is a simplified schematic diagram showing a portion of a CAM array in accordance with a fifth specific embodiment of the present invention.

In accordance with another possible modification, each mask memory cell may be utilized to control two or more control circuits arranged in a column of a CAM array. For example, FIG. 7 shows a portion of a CAM array 300 in accordance with a fifth embodiment of the present invention. CAM array 300 includes several quad CAM cells 310, each including a first comparator circuit 120(1) and a first control circuit 140(1) connected between a first match line $MATCH_1$ and a first low match line $LM_1$, and a second comparator circuit 120(2) and a second control circuit 140(2) connected between a second match line $MATCH_2$ and a second low match line $LM_2$. First control circuit 120(1) is controlled by a first data value stored in a first SRAM cell 110(1), and second control circuit 120(2) is controlled by a second data value stored in a second SRAM cell 110(2). A single mask memory cell 130B controls both first control circuit 140(1) and second control circuit 140(2). According to the fifth embodiment shown in FIG. 7, the average ratio of CAM cell size to stored data values is reduced by sharing one mask memory cell between two or more control circuits in a column of CAM array 300. Note that quad CAM cells 310 may be modified using known techniques such that mask memory cells 130B control, for example, four, eight, or sixteen control circuits in the manner shown in FIG. 7.

Figure 8:
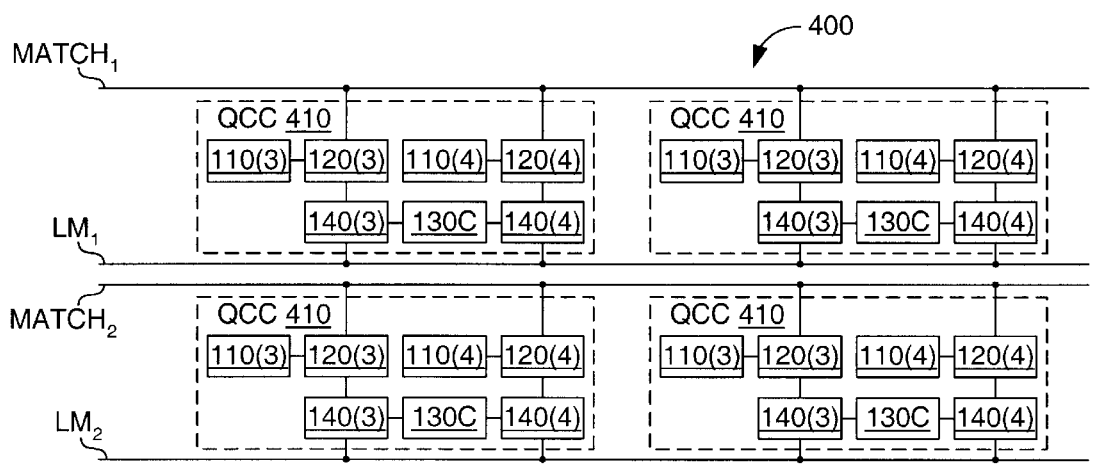
FIG. 8 is a simplified schematic diagram showing a portion of a CAM array in accordance with a sixth specific embodiment of the present invention.

In accordance with yet another possible modification, each mask memory cell may be utilized to control two or more control circuits arranged in a row of a CAM array. For example, FIG. 8 shows a portion of a CAM array 400 in accordance with a sixth embodiment of the present invention that includes several quad CAM cells 410, each including a first comparator circuit 120(3) and a first control circuit 140(3) connected between a first match line $MATCH_1$ and a first low match line $LM_1$, and a second comparator circuit 120(4) and a second control circuit 140(4) also connected between first match line $MATCH_1$ and first low match line $LM_1$. First control circuit 120(3) is controlled by a first data value stored in a first SRAM cell 110(3), and second control circuit 120(3) is controlled by a second data value stored in a second SRAM cell 110(3). A single mask memory cell 130C controls both first control circuit 140(3) and second control circuit 140(3). Similar to the fifth embodiment, the sixth embodiment reduces the average ratio of CAM cell size to stored data values by sharing one mask memory cell between two or more control circuits in a row of CAM array 400. Note that quad CAM cells 410 may be modified using known techniques such that mask memory cells 130C control additional control circuits.

In view of these and other possible modifications, the invention is limited only by the following claims.

We claim:

1. A quad CAM cell comprising:
    a first memory cell for storing a stored data value;
    a comparator circuit having a first control terminal connected to the first memory cell and a second control terminal connected to receive an applied data value;
    a second memory cell for storing a care/don't care data value; and
    a control switch connected in series with the comparator switch between a match line and a discharge line, the control switch having a control terminal connected to the second memory cell;
    wherein, during a compare operation, the comparator circuit and the control switch selectively opens a path between the match line and the discharge line when the applied data value fails to match the stored data value, and the care/don't care data value is equal to a predetermined value.

2. The quad CAM cell according to claim 1, wherein the first memory cell comprises an SRAM cell including a latch for storing the stored data value at a first node, and an inverse of the stored data value at a second node.

3. The quad CAM cell according to claim 2, wherein the SRAM cell further comprises:
    a first p-channel transistor connected between a first voltage source and the second node, the first p-channel transistor having a gate terminal connected to the first node;
    a second p-channel transistor connected between the first voltage source and the first node, the second p-channel transistor having a gate terminal connected to the second node;
    a first n-channel transistor connected between a second voltage source and the second node, the first n-channel transistor having a gate terminal connected to the first node;
    a second n-channel transistor connected between the second voltage source and the first node, the second n-channel transistor having a gate terminal connected to the second node;
    a first access transistor connected between a first data line and the first node, the first pass transistor having a gate terminal connected to a word line; and
    a second access transistor connected between a second data line and the second node, the second pass transistor having a gate terminal connected to the word line.

4. The quad CAM cell according to claim 2, wherein the comparator circuit comprises:
    a first pass transistor having a gate terminal connected receive the applied data signal; and
    a second pass transistor connected in series with the first pass transistor and having a gate terminal connected to the second node.

5. The quad CAM cell according to claim 4, wherein the control switch comprises a third pass transistor connected between the comparator circuit and the match line.

6. The quad CAM cell according to claim 5, wherein the comparator circuit further comprises:
    a fourth pass transistor having a gate terminal connected to receive an inverse of the applied data signal; and
    a fifth pass transistor connected in series with the third pass transistor and having a gate terminal connected to the first node,
    wherein the fourth pass transistor and the fifth pass transistor are connected in parallel with the first pass transistor and the second pass transistor between the control switch and the discharge line.

7. The quad CAM cell according to claim 4, wherein the control switch comprises a third pass transistor connected between the comparator circuit and the discharge line.

8. The quad CAM cell according to claim 7, wherein the comparator circuit further comprises:
   a fourth pass transistor having a gate terminal connected receive an inverse of the applied data signal; and
   a fifth pass transistor connected in series with the third pass transistor and having a gate terminal connected to the first node,
   wherein the fourth pass transistor and the fifth pass transistor are connected in parallel with the first pass transistor and the second pass transistor between the control switch and the match line.

9. The quad CAM cell according to claim 2,
   wherein the comparator circuit comprises:
      a first pass transistor having a gate terminal connected receive the applied data signal; and
      a second pass transistor having a gate terminal connected to the second node, and
   wherein the control switch is connected in series between the first pass transistor and the second pass transistor.

10. The quad CAM cell according to claim 9,
    wherein the first pass transistor is connected between the control switch and the discharge line, and
    wherein the second pass transistor is connected between the control switch and the match line.

11. The quad CAM cell according to claim 10, wherein the comparator circuit further comprises:
    a fourth pass transistor having a gate terminal connected receive an inverse of the applied data signal, the fourth pass transistor being connected in parallel with the first pass transistor between the control switch and the discharge line; and
    a fifth pass transistor having a gate terminal connected to the first node, the fifth pass transistor being connected in parallel with the second pass transistor between the control switch and the match line.

12. The quad CAM cell according to claim 2, wherein the comparator circuit comprises:
    a first pass transistor having a gate terminal connected the second node, a first terminal connected to receive the first data signal, and a second terminal,
    a second pass transistor having a gate terminal connected to the first node, a first terminal connected to receive the first data signal, and a second terminal; and
    a third pass transistor having a gate terminal to the second terminals of the first and second pass transistors,
    wherein the third pass transistor is connected in series with the control switch between the match line and the discharge line.

13. The quad CAM cell according to claim 2, the control switch comprises a fourth pass transistor connected between the third pass transistor and the match line.

14. The quad CAM cell according to claim 1, wherein the second memory cell comprises an SRAM cell.

15. The quad CAM cell according to claim 1, wherein the second memory cell comprises a non-volatile memory cell.

16. A CAM cell array comprising a plurality of quad CAM cells arranged in rows and columns, each row of quad CAM cells being connected to an associated match line, and each column of quad CAM cells being connected to an associated data line, wherein each quad CAM cell comprises:

a first memory cell for storing a stored data value;
   a comparator circuit having a first control terminal connected to the first memory cell and a second control terminal connected to the associated data line;
   a second memory cell for storing a care/don't care data value; and
   a control switch connected in series with the comparator switch between the associated match line and a discharge line, the control switch having a control terminal connected to the second memory cell;
   wherein, during a compare operation, the comparator circuit and the control switch open a path between the associated match line and the discharge line only when an applied data value transmitted on the associated data line is equal to the stored data value, thereby turning on the comparator circuit, and the care/don't care data value is equal to a predetermined value that turns on the control switch.

17. The CAM cell array according to claim 16, wherein each quad CAM cell further comprises:
    a second data memory cell for storing a second stored data value;
    a second comparator circuit having a control terminal connected to the second data memory cell; and
    a second control switch connected in series with the second comparator circuit between a second match line and a second discharge line,
    wherein the second control switch includes a control terminal connected to the mask memory cell.

18. The CAM cell array according to claim 16, wherein each quad CAM cell further comprises:
    a second data memory cell for storing a second stored data value;
    a second comparator circuit having a control terminal connected to the second data memory cell; and
    a second control switch connected in series with the second comparator circuit between the associated match line and the discharge line,
    wherein the second control switch includes a control terminal connected to the mask memory cell.

19. A CAM cell array comprising a plurality of quad CAM cells arranged in rows and columns, each row of quad CAM cells being connected to an associated match line, and each column of quad CAM cells being connected to an associated data line, wherein each quad CAM cell comprises:
    a memory cell for storing a stored data value;
    comparator means for comparing the stored data value with an applied data value transmitted on the associated data line, and for opening a first part of a signal path between the associated match line and the discharge line only when the stored data value fails to match the applied data value; and
    control means connected in series with the comparator means for receiving a care/don't care data value, and for opening a second part of a signal path between the associated match line and the discharge line only when the care/don't care data value is equal to a predetermined data value.

20. The CAM cell array according to claim 19, further comprising a mask memory cell for storing the care/don't care data value.

* * * * *